United States Patent
Yu et al.

(10) Patent No.: US 6,492,948 B1
(45) Date of Patent: Dec. 10, 2002

(54) ANTENNA BASE

(75) Inventors: Ching-Chiang Yu, Keelung (TW); Yen-Liang Kuan, Jia Yi (TW)

(73) Assignee: Behavior Tech Corporation, Taipei (TW)

( * ) Notice: Subject to any disclaimer, the term of this patent is extended or adjusted under 35 U.S.C. 154(b) by 0 days.

(21) Appl. No.: 09/893,286

(22) Filed: Jun. 28, 2001

(51) Int. Cl.[7] .................................................. H01Q 1/38

(52) U.S. Cl. ............................... 343/700 MS; 343/846; 343/848

(58) Field of Search ......................... 343/700 MS, 702, 343/873, 895, 846, 848

(56) References Cited

U.S. PATENT DOCUMENTS 5,581,262 A * 12/1996 Kawahata et al. ... 343/700 MS
6,335,548 B1 * 1/2002 Roberts et al. ............... 257/98

* cited by examiner

Primary Examiner—Don Wong
Assistant Examiner—James Clinger
(74) Attorney, Agent, or Firm—Rosenberg, Klein & Lee

(57) ABSTRACT

This invention relates to an antenna base, comprising a printed circuit board. A base is designed in a region at an appropriate location on the printed circuit board. The base is printed with silver glue on the printed circuit board. This base serves as the antenna base, or this base along with the printed circuits on the printed circuit boards form the antenna base, so that the antenna can effectively transmit signals when the keyboard, mouse or other computer peripheral equipment is connected with the antenna.

3 Claims, 2 Drawing Sheets

ANTENNA BASE

BACKGROUND OF THE INVENTION

1. Field of the Invention

This invention relates to an antenna base, particularly an antenna base that is applied to the keyboard, mouse or other computer peripheral equipment, to enable the antenna to effectively transmit signals when the antenna is installed on the keyboard.

2. Background of the Invention

Since multi-media keyboards have been widely used in all applications, the incorporation of antenna has become essential for personal computer, in addition to the installation of speakers. As far as the keyboard is concerned, connection with an antenna shall include such considerations as the structural assembly of the keyboard and the antenna, as well as the base for the antenna, so the antenna can effectively transmit signals. Therefore, the conventional keyboard is often installed with a set of antenna base that is connected externally to enable the antenna to transmit signals. However, external connection of antenna base will increase cost expenditure and occupy much space. Furthermore, it needs much time and labor in assembling processes. Such problems are caused by the fact that the antenna base is externally connected or fitted as a peripheral.

A regular keyboard, mouse or other computer peripheral is always installed with a flexible printed circuit board or other type of printed circuit board. Most of the circuits printed on the printed circuit board are silver, or generally known as silver glue. Silver is an excellent conducting material that can be used as a conducting tool. Therefore, silver glue is used in this invention to make the antenna base by way of printing.

BRIEF DESCRIPTION OF THE INVENTION

The main objective of this invention is to provide an antenna base, comprising a printed circuit board. A base is provided in a region at an appropriate location on the printed circuit board. The base is printed with silver glue on the printed circuit board. This base serves as the antenna base, or this base works with the printed circuits on the printed circuit board to form the antenna base, so that the antenna will be able to transmit signals when the keyboard is connected with the antenna.

Therefore, when the printed circuit board is printed with regular circuits, the silver glue for the antenna base can be printed onto it simultaneously, saving much costs and processes in production and installation for regular antenna bases. Whether individual regions are employed or existing printed circuits are incorporated for this invention of antenna base, basically silver is employed for conductance, so the antenna can have excellent signal transmission efficiency.

The aforementioned printed circuit board can be a regular printed circuit board or a flexible printed circuit board. Meanwhile, the antenna base is also produced by printing. Therefore, we can assure high rate of satisfactory products, excellent precision, reduced costs and production processes. By way of printing process, we can effectively control the antenna properties and consistent quality, and produce antennas of various styles, types and sophisticated models.

DETAILED DESCRIPTION OF PREFERRED EMBODIMENT

Figure 1:
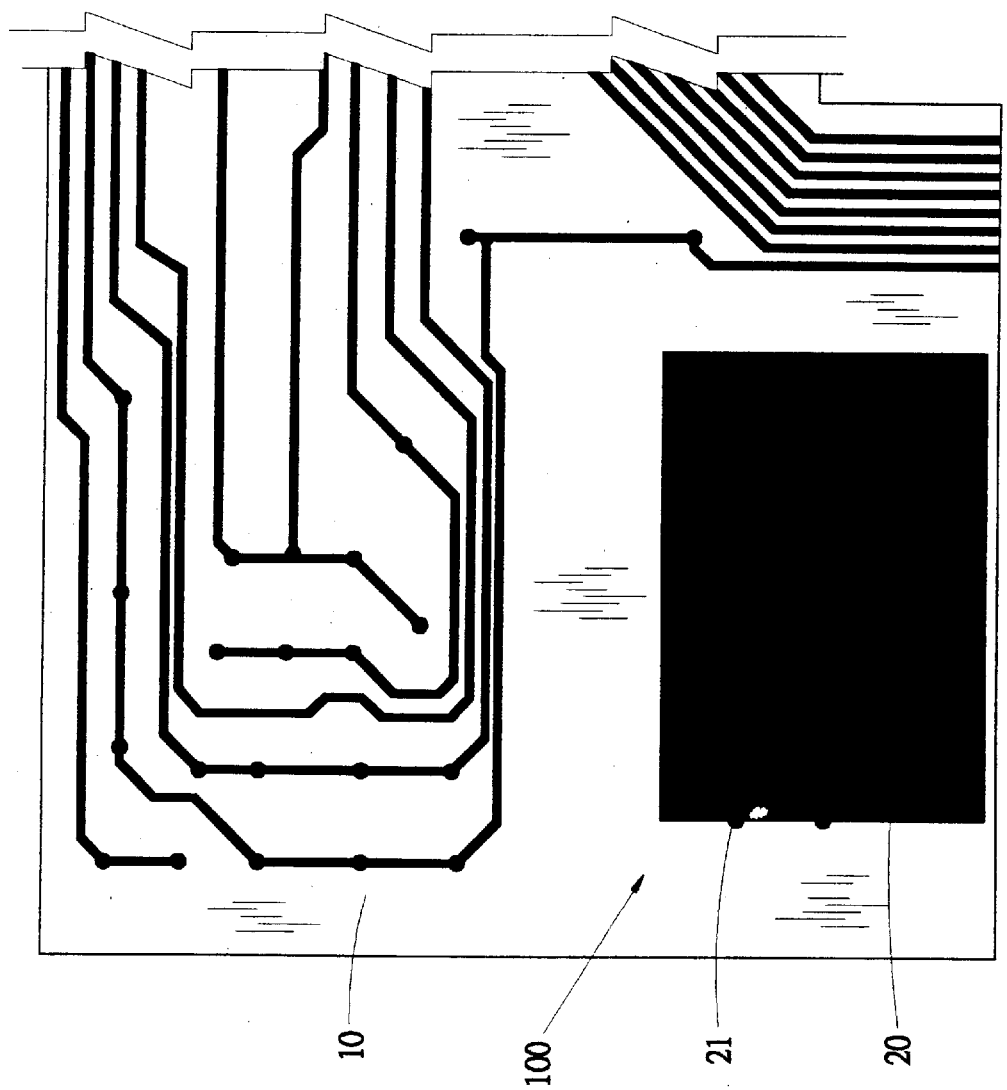
FIG. 1 is a view of the first preferred embodiment of the invention of antenna base.

As shown in FIG. 1, the invention of antenna base 100 has a base 20 provided for a region at an appropriate location of a printed circuit board 10, the base 20 is printed on the printed circuit board 10 by silver-glue printing process. On the side of the base 20 are connecting points 21 for connection with the antenna. This base 20 serves as the antenna base, the entire region of the base 20 is completely coated with glue to provide excellent conductivity, so that when the keyboard, mouse or other computer peripherals are used in connection with the antenna, the antenna will be able to effectively transmit signals.

Figure 3:
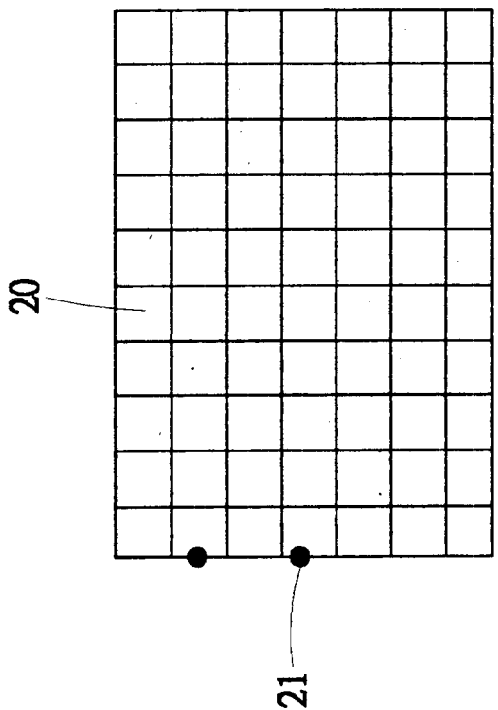
FIG. 3 is a view of the third preferred embodiment of the invention of antenna base.
Figure 2:
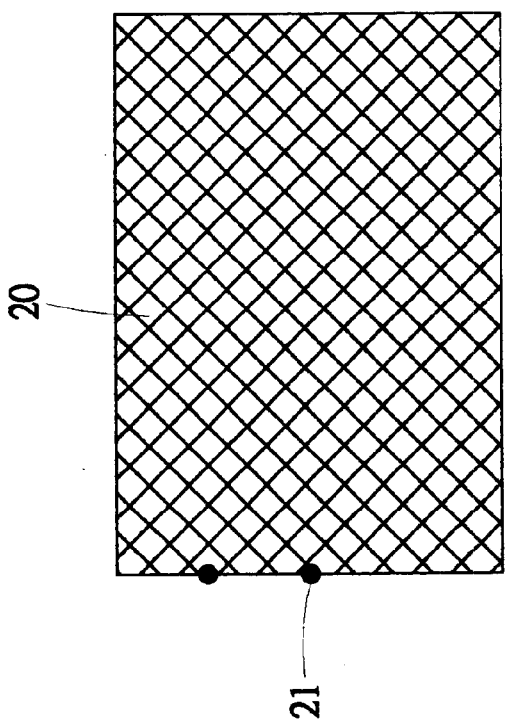
FIG. 2 is a view of the second preferred embodiment of the invention of antenna base.

As shown in FIG. 2, the base 20 provided by antenna base of the invention can be printed with grilled lines to serve the purpose of signal transmission. Likewise, as shown in FIG. 3, the base 20 can also be printed with biased grilles to achieve the anticipated objective.

In addition to the aforementioned style of antenna base, this invention of antenna base can also be designed as line patterns surrounding the circuit board, or as open loops, or other various shapes. All of them can serve as an antenna base to serve the purpose of antenna transmission.

Furthermore, since the circuits printed on regular printed circuit boards also contain silver glue, the original printed circuits can be incorporated to form a joint antenna base, which can be applicable for regular printed circuit boards or flexible printed circuit boards. Besides the keyboards, the circuit boards of mouse or other computer peripheral equipment can also be installed with the antenna base of the invention.

The silver glue to be coated can also be replaced by other materials with excellent conductivity properties, so long as they provide excellent transmission performance.

Since the original printed circuit boards are printed, this invention of antenna base can also be printed. So that the process can be accomplished during its production, saving costs, production procedures and working hours. Without the need of an additional independent antenna base, the effects and applicability of this invention can be affirmed.

What is claimed is:

1. An antenna base comprising a printed circuit board, said printed circuit board having a base defined by an area having a closed contour printed thereon with a silver glue, said closed contour being entirely coated by said silver glue and devoid of circuit components, said base having a connecting point formed on a perimeter edge thereof.

2. An antenna base comprising a printed circuit board, said printed circuit board having a base defined by an area having a closed contour printed thereon with a silver glue, said silver glue being printed on perimeter edges of said area and internal said closed contour as a plurality of intersecting grid lines, said base having a connecting point formed on one of said perimeter edge thereof.

3. The antenna base as recited in claim 2, wherein said grid lines are angularly directed with respect to said perimeter edges.

* * * * *